Sept. 14, 1965 J. C. POLASEK 3,206,685
NON-LINEAR AMPLIFIER CIRCUIT
Filed June 13, 1961

INVENTOR.
John Polasek
BY
Paul J. Ethington
ATTORNEY.

3,206,685

NON-LINEAR AMPLIFIER CIRCUIT

John C. Polasek, Orlando, Fla., assignor to General Motors Corporation, Detroit, Mich., a corporation of Delaware Filed June 13, 1961, Ser. No. 116,727
5 Claims. (Cl. 328—142)

Figure 1:
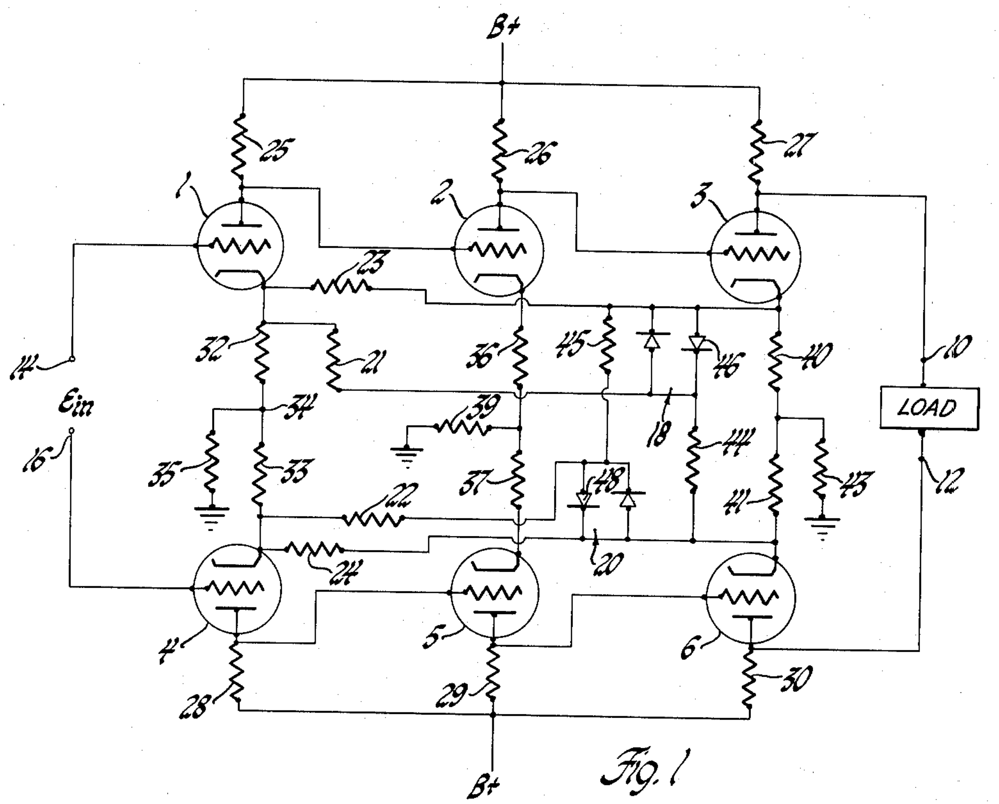

This invention relates to amplifier circuits and more particularly to a servo amplifier having signal voltage sensitive, feedback paths to obtain a non-linear transfer characteristic.

Ordinarily, an amplifier may employ negative feedback to obtain a linear transfer characteristic over the entire range of operation. However, it has been found necessary for some purposes to obtain a special non-linear characteristic for the compensation of some undesirable non-linearity in the transfer characteristic of the load device. For example, an amplifier circuit may be used in combination with a drive amplifier, a motor, and a rotatable load device having a high degree of static friction in its bearings which must be overcome before the motor will rotate the load device. In order to insure rotation of the load for low input levels to the amplifier circuit, the amplifier circuit must be made to have a very high gain for low signal levels and a moderate gain for signals above a certain level.

It is, accordingly, an object of this invention to provide an amplifier circuit having a non-linear characteristic whereby the amplifier has a high gain for input signals below a predetermined level and moderate gain for signals above this predetermined input level. This is accomplished through the use of both positive and negative feedback circuitry including signal voltage sensitive means to render ineffective the positive feedback paths in the amplifier circuit upon input signals reaching a predetermined level.

Embodying the present invention in an amplifier circuit wherein points of opposite phase in the amplifier output circuit are mutually connected to a point in the amplifier input circuit to provide both positive and negative feedback, it is possible to sharply increase the negative feedback at a predetermined value of input voltage thus reducing the amplifier gain for all input voltages above the predetermined level. This is accomplished through the use of diode pairs connected in parallel back-to-back configuration between the points of mutually opposite phase in the amplifier output circuit and adapted to operate at the predetermined input voltage to switch the positive feedback circuit into a parallel connection with the negative feedback circuit thereby providing a lower impedance to the negative feedback current.

The invention may be embodied in either a single stage or plural stage push-pull amplifier employing both positive and negative feedback. In the case of a plural stage push-pull amplifier having positive and negative feedback circuits cross-connected between two stages, the amplifier can be made to have a special non-linear transfer characteristic. This is accomplished by connecting voltage sensitive diodes between the positive and negative feedback circuits which are adapted to switch elements in the positive feedback circuit into parallel connection with elements in the negative feedback circuit thereby increasing the negative feedback current.

Figure 2A:
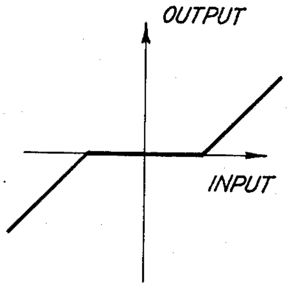
Figure 2B:
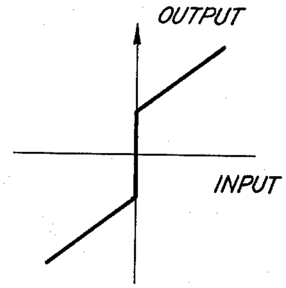
Figure 2C:
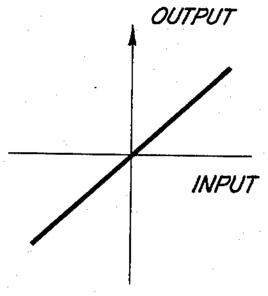

The operation of this invention will become more apparent in the following description, taken with the accompanying drawings in which:

FIGURE 1 illustrates a particular embodiment of the invention in a three stage push-pull amplifier circuit;

FIGURE 2*a* is the transfer characteristic of a load showing the undesirable non-linearity for which the circuit of FIGURE 1 may compensate;

FIGURE 2*b* is an illustration of the transfer characteristic which can be attained from the circuit shown in FIGURE 1; and FIGURE 2*c* is the resulting linear transfer characteristic obtained from driving a load whose transfer characteristic is that of FIGURE 2*a* with a circuit whose transfer characteristic is that of FIGURE 2*b*.

FIGURE 1 is illustrative of the invention as embodied in a three stage push-pull amplifier circuit which is adapted to vary the voltage across a pair of output terminals 10 and 12 in accordance with the level of the signal appearing across the input terminals 14 and 16. The first, second and third stages of the amplifier comprise amplifying devices 1 and 4, 2 and 5, and 3 and 6, respectively, which are connected such that the amplifier stages are cascaded. The amplifying devices may, for example, be triode tubes having plate, cathode and control electrodes to be connected in each tube's output, common, and input circuits, respectively; however, it is contemplated that other amplifying devices could be substituted according to the operating characteristics desired. For purposes of discussion, tubes 1, 2 and 3 will be referred to as "corresponding tubes" with respect to each other, as are tubes 4, 5 and 6. Also, tubes 1, 2 and 3 will be identified as being "opposite tubes" with respect to any of the tubes 4, 5 and 6. Where an amplifier having a plurality of amplifying stages is used, feedback circuits may be connected between the output circuit of a stage and the input circuit of that stage or any preceding stage to obtain various effects of feedback on the amplifier gain as desired. This amplifier circuit employs negative feedback between the output circuits of tubes in the third stage and the input circuits of corresponding tubes in the first stage through resistors 23 and 24, which, if used alone, would result in a linear amplifier transfer characteristic. However, positive feedback paths are provided between the input and output circuits of opposite tubes in the first and third stages, respectively, via series resistors 21 and 44, and 22 and 45 to oppose the negative feedback. Connected between the positive and negative feedback paths are two pairs of diodes 18 and 20. The effect of these diodes is to alter the feedback paths such that the gain of the amplifier circuit is less at input values above a predetermined value than below the predetermined value. The diodes used herein may be silicon diodes having a relatively low forward breakdown voltage and a relatively high reverse breakdown voltage. Once full conduction is established in a forward direction, the resistance of the diode is negligible and may be considered as a short circuit. The resistance to reverse current is such that the diode may be considered as an open circuit during reverse bias.

Referring now to the circuit in greater detail, the amplifier comprises triode tubes 1–6, all of which are substantially alike. The plate electrode of the triodes are all connected to the positive terminal of a D.C. voltage source B+ through respective series resistors 25–30. The source B+ has its negative terminal connected to ground and is of such a magnitude as to efficiently supply the current requirements of the particular triodes used. The cathode leads of triodes 1 and 4 are connected to respective series resistors 32 and 33, these two resistors being connected at a common point 34. The point 34 is then connected to ground through a resistor 35. Similarly, the cathode leads of triodes 2 and 5 are connected to ground through resistors 36, 37 and 39, and the cathode leads of triodes 3 and 6 are connected to ground through resistors 40, 41 and 43. The output circuit of each triode then extends from the positive terminal of the source B+ through the plate to cathode circuit of each triode through the resistor circuit appropriate to each triode to ground and thus to the negative terminal of the source B+. The input circuits to the grids of triodes 1 and 4 are connected across the input terminals 14 and 16 such that the input signal will be applied simultaneously to the grids of triodes 1 and 4 but with opposite polarities. The input circuits to the grids of triodes 2 and 5 are connected directly to the plate leads of corresponding triodes 1 and 4, respectively. In this manner, the triodes 2 and 5 receive signals which tend to drive them toward opposite levels of conduction to that of their corresponding triodes 1 and 4. That is, increasing conduction in triode 1 results in decreasing conduction in triode 2, and so on. The input circuits to the grids of triodes 3 and 6 are similarly connected directly to the plate leads of corresponding triodes 2 and 5, respectively, thus being driven toward opposite levels of conduction from that of the corresponding triodes 2 and 5. Then plate leads of triodes 3 and 6 are connected to the output terminals 10 and 12.

Thus far the circuit described is that of a conventional three stage push-pull amplifier which is normally operated at a relatively high gain. The following description relates to feedback circuitry included in the amplifier circuit to lower the gain to a significant degree upon the input signal reaching a predetermined level. The cathode lead of triode 3 is connected to the cathode lead of triode 1 through a resistor 23. The cathode lead of triode 6 is connected to the cathode lead of triode 4 through a resistor 24. The resistors 23 and 24 thus provide negative feedback paths between the first and third amplifier stages; that is, a condition of increasing conduction in stage 3, for example, will transmit a signal to stage 1 whereupon stage 1 will be affected in such a manner as to oppose the condition in stage 3. In this manner, the system tends to be stabilized at a low gain value. The cathode leads of triodes 3 and 6 are also connected to the cathode leads of opposite first stage triodes 4 and 1 by means of resistor paths 22, 45 and 21, 44, respectively. These paths provide positive feedback whereby a condition in the third amplifier stage transmits a signal to the first amplifier stage such that the first amplifier stage acts to increase the existing condition in the third amplifying stage. This positive feedback through resistors 21, 44 and 22, 45 opposes the negative feedback through resistors 23 and 24 thus augmenting the gain of the amplifier to any desired extent.

In order to accomplish the desired gain change at a predetermined value of input, a pair of diodes 18 is connected between the cathode lead of triode 3 and the connection point between feedback resistors 21 and 44 in parallel back-to-back configuration so as to be capable of conduction in opposite directions. A second pair of diodes 20 is similarly connected between the cathode lead of triode 6 and the connection point between feedback resistors 22 and 45. One of the diodes in each of the pairs 18 and 20 will become conductive when the voltage between the cathodes of triodes 3 and 6 exceeds the threshold or forward breakdown voltage of the diodes, thus connecting resistors 21 and 22 directly to the cathodes of triodes 3 and 6, respectively. The voltage between the cathodes of triodes 3 and 6 will correspond to the magnitude and direction of the input signal to terminals 14 and 16, and, therefore, the diode pairs 18 and 20 must be capable of conduction in both directions.

Considering the operation of the circuit in detail, a signal applied such that the input terminal 14 is positive with respect to terminal 16 acts to increase the conduction of triode 1. With current flowing from the source B+ through the resistor 25, the plate to cathode circuit of triode 1, and the resistors 32 and 35, the plate electrode of triode 1 becomes more negative, thus applying a negative signal to the grid of triode 2 thereby tending to cut triode 2 off. Decreasing current through triode 2 tends to make the plate electrode of triode 2 more positive, thus applying a positive signal to the grid of triode 3 whereby it becomes more conductive. Increased current through triode 3 causes the plate of that triode to become more negative thus applying a negative-going signal to the output terminal 10. While the terminal 14 is positive, the input terminal 16 is negative thus applying a negative signal to the grid of triode 4 whereby it becomes less conductive. Applying similar reasoning to that described above to the triodes 4, 5, and 6, it is shown that the output terminal 12 will receive a positive-going signal from the plate lead of triode 6. A positive-going signal on the input terminals 16, with respect to input terminal 14, causes an action opposite to that described above, resulting in output terminal 10 becoming positive with respect to terminal 12.

With a positive-going signal on terminal 14 with respect to terminal 16, an amplified positive-going signal on the cathode of triode 3 is applied by means of resistor 23 to the cathode of triode 1 thereby tending to cut triode 1 off. As previously stated, decreasing current through triode 1 will result in decreasing current through triode 3. Thus the path provided by resistor 23 is one of negative feedback. Similarly, the resistor 24 provides negative feedback from the cathode of triode 6 to the cathode triode 4. The cathode of triode 1 is also connected by means of resistors 21 and 24 to the cathode of triode 6 and thus receives an amplified negative-going signal therefrom. A negative-going signal applied to the cathode of triode 1 tends to increase conduction of the triode 1 and thus positive feedback is provided. A similar positive feedback path comprising resistors 22 and 45 connects the cathode of triode 4 to the cathode of triode 3. The foregoing description applies to operation of the circuit with input signals below a critical level such that the voltage between the cathodes of triodes 3 and 6 is insufficient to cause a diode in each of the pairs 18 and 20 to become conductive. Should the input exceed this critical value, one of the diodes in each pair 18 or 20 will become conductive thus altering the feedback paths as defined above.

Considering the cathode of triode 3 to be positive with respect to the triode 6, to the extent that diodes 46 and 48 become conducive, resistors 21 and 23 are placed in a parallel combination as are resistors 22 and 24. With a positive signal on terminal 14, the cathodes of tubes 3 and 1 are both positive and the cathodes of triodes 6 and 4 are both negative. However, because of the amplification of the three stages, the cathode of triode 3 will be more positive than the cathode of triode 1 and the cathode of triode 6 will be more negative than the cathode of triode 4, thus prompting a current flow through the feedback paths connecting these cathodes. Feedback current from triode 3 flows through the resistors 21 and 23, which are now in parallel by virtue of diode 46, through the resistors 32 and 35 to ground. The potential of cathode 1 is then driven more positive and negative feedback results. Similarly, feedback current from triode 4 flows through the resistors 22 and 24, which are now in parallel by virtue of diode 48, through the resistors 41 and 43 to ground, the effect being the application of a negative signal to the cathode of triode 4 thus providing negative feedback between triodes 6 and 4. Due to the diode action paralleling the resistors 21, 44 and 22, 45, the negative feedback current encounters a smaller impedance and therefore is greatly increased and has more influence on the amplifier circuit than does the positive feedback current and the gain of the amplifier is thus greatly reduced during the time the input signal level exceeds the value required to operate the diodes.

As previously stated, the symmetry of the circuit results in the transfer characteristic closely approximating which is seen in FIGURE 2*b*, that is, symmetrical about the output axis. Application of this circuit to a load device, having a transfer characteristic like that shown in FIGURE 2*a*, results in a final operating characteristic which is linear over the entire region of operation as shown in FIGURE 2*c*.

It is to be understood that the specific embodiments of the invention shown and described herein are illustrative and that various modifications and variations thereof may be made without departing from the spirit and scope of this invention.

I claim:

1. A non-linear amplifier circuit of the push-pull type comprising a plurality of cascaded amplifying stages, each stage including a pair of amplifying devices, an input circuit connected to the first of the stages to receive for amplification an alternating input signal of variable amplitude, an output circuit connected to the last of the stages for connection to a load device, a pair of negative feedback paths connected between the first and last stages tending to stabilize the gain of the circuit, a pair of positive feedback paths connected between the first and last stages tending to increase the gain of the circuit, switching means interconnecting the positive and negative feedback paths and responsive to the magnitude and polarity of the output signal to switch a portion of each of the positive feedback paths into parallel circuit relation with a respective negative feedback path for all input signal magnitudes greater than a predetermined value, thereby lowering the gain of the amplifier circuit to a value substantially less than that which exists at input signal values smaller than the predetermined value.

2. A non-linear amplifier circuit comprising an amplifying device having an input circuit adapted to receive an input signal of variable amplitude, an output circuit adapted for connection with a load device, a negative feedback circuit connected between the output circuit and the input circuit tending to reduce the gain of the amplifier, a positive feedback circuit connected between the output circuit and the input circuit tending to increase the gain of the amplifier, and output voltage responsive means interconnecting the positive and negative feedback circuits and adapted to switch a portion of the positive feedback circuit into parallel circuit relation with the negative feedback circuit thereby to substantially increase the negative feedback at a voltage corresponding to a predetermined input signal amplitude whereby the amplifier gain is decreased for all input signals having an amplitude greater than the predetermined amplitude.

3. A non-linear amplifier circuit comprising an amplifying device having an input circuit adapted to receive an input signal of variable amplitude, an output circuit adapted for connection with a load device, a negative feedback circuit including a first impedance element connected between the output circuit and the input circuit tending to reduce the gain of the amplifier, a normally operative positive feedback circuit including a second impedance element connected between the output circuit and the input circuit tending to increase the gain of the amplifier, and voltage responsive means including a diode connected between the positive and negative feedback circuits to switch the second impedance element into a parallel connection wtih the first impedance element at a voltage corresponding to a predetermined input signal amplitude whereby the amplifier gain is decreased for all input signals having an amplitude greater than the predetermined amplitude.

4. A non-linear amplifier circuit comprising a plurality of amplifying stages connected in cascade, an input circuit connected to the first stage to receive for amplification an input signal of variable magnitude, an output circuit connected to the last of the plurality of stages for connection to a load, a positive feedback path interconnecting two of the stages, a negative feedback path interconnecting said two stages, switching means interconnecting the positive and negative feedback path and responsive to an output voltage corresponding to a predetermined input signal magnitude to switch a portion of the positive feedback path into parallel circuit relation with the negative feedback path thereby to increase the effect of the negative feedback for all input signals greater than the predetermined magnitude.

5. A non-linear amplifier circuit, the combination comprising three push-pull amplifying stages, each stage comprising two electron tubes each tube having plate, cathode and control electrodes, the cathodes of the tubes in each stage being connected through respective resistors to ground, a direct voltage source, the positive terminal of the source being connected through respective resistors to the plate of each tube, the negative terminal of the source being connected to ground, a pair of input terminals connected respectively to the control electrodes of the tubes in the first stage, the plates of the tubes in the first stage being connected to the control electrodes of corresponding tubes in the second stage, the plates of the tubes in the second stage being connected to the control electrodes of corresponding tubes in the third stage, a pair of output terminals being connected respectively to the plates of the tubes in the third stage, positive feedback circuits connecting the cathodes of the tubes in the third stage to the cathodes of respectively opposite tubes in the first stage, said positive feedback circuits each comprising two series connected resistors, negative feedback circuits connecting the cathodes of the tubes in the third stage to the cathodes of respectively corresponding tubes in the first stage, said negative feedback circuits each comprising a single resistor, two pairs of diodes, each pair being connected in parallel back-to-back configuration between the cathodes of respective third stage tubes and the junctions between the series resistors of the positive feedback circuits which are connected to the cathodes of respectively opposite third stage tubes, whereby at a predetermined input signal level such that the voltage across the diode pairs exceeds the forward breakdown voltage thereof, the resistor in each of the positive feedback circuits which is mutually connected with a negative feedback resistor to the cathode of a first stage tube is switched into a parallel connection with the mutually connected negative feedback resistor to provide a lower impedance path to the negative feedback current thereby lowering the amplifier gain to a value substantially less than that which exists at input values smaller than said predetermined value.

References Cited by the Examiner

UNITED STATES PATENTS

| | | | |
|---|---|---|---|
| 2,763,732 | 9/56 | Rockwell | 330—82 |
| 2,983,880 | 5/61 | McFadden | 307—88.5 |
| 2,986,707 | 5/61 | Blecher | 330—86 |
| 2,997,602 | 8/61 | Eachus | 307—88.5 |
| 3,002,109 | 9/61 | Baird | 328—209 |
| 3,018,433 | 1/62 | Stone | 307—88.5 |

ARTHUR GAUSS, *Primary Examiner.*

GEORGE N. WESTBY, *Examiner.*